US012119376B2

(12) United States Patent
Willmeroth et al.

(10) Patent No.: US 12,119,376 B2
(45) Date of Patent: Oct. 15, 2024

(54) POWER SEMICONDUCTOR DEVICE HAVING VERTICALLY PARALLEL P-N LAYERS FORMED IN AN ACTIVE REGION UNDER TRANSISTOR CELLS AND UNDER A NON-DEPLETABLE EXTENSION ZONE FORMED IN THE EDGE REGION

(71) Applicant: Infineon Technologies Austria AG, Villach (AT)

(72) Inventors: Armin Willmeroth, Augsburg (DE); Franz Hirler, Isen (DE); Bjoern Fischer, Munich (DE); Joachim Weyers, Hoehenkirchen-Siegertsbrunn (DE)

(73) Assignee: Infineon Technologies Austria AG, Villach (AT)

( * ) Notice: Subject to any disclaimer, the term of this patent is extended or adjusted under 35 U.S.C. 154(b) by 638 days.

(21) Appl. No.: 16/587,631

(22) Filed: Sep. 30, 2019

(65) Prior Publication Data
US 2020/0027949 A1 Jan. 23, 2020

Related U.S. Application Data

(62) Division of application No. 14/277,506, filed on May 14, 2014, now Pat. No. 10,468,479.

(51) Int. Cl.
*H01L 29/78* (2006.01)
*H01L 29/06* (2006.01)
(Continued)

(52) U.S. Cl.
CPC ........ *H01L 29/0634* (2013.01); *H01L 29/402* (2013.01); *H01L 29/7802* (2013.01);
(Continued)

(58) Field of Classification Search
CPC ............ H01L 29/0634; H01L 29/0646; H01L 29/7811
See application file for complete search history.

(56) References Cited

U.S. PATENT DOCUMENTS 6,274,905 B1 8/2001 Mo
6,498,368 B2 12/2002 Sakamoto et al.
(Continued)

FOREIGN PATENT DOCUMENTS

CN 1304180 A 7/2001
CN 100349301 C 11/2007
(Continued)

*Primary Examiner* — Anh D Mai
(74) *Attorney, Agent, or Firm* — Murphy, Bilak & Homiller, PLLC

(57) ABSTRACT

A switched-mode power supply includes a power semiconductor device that includes a semiconductor body comprising transistor cells and a drift zone between a drain layer and the transistor cells, the transistor cells comprising source zones, wherein the device exhibits a first output charge gradient when a voltage between the drain layer and the source zones of the transistor cells increases from a depletion voltage of the semiconductor device to a maximum drain/source voltage of the semiconductor device, wherein the device exhibits a second output charge gradient when a voltage between the drain layer and the source zones of the semiconductor device decreases from the maximum drain/source voltage to the depletion voltage of the semiconductor device, and wherein the semiconductor device is configured such that the first output charge gradient deviates by less than 5% from the second output charge gradient.

14 Claims, 14 Drawing Sheets

(51) Int. Cl.
*H01L 29/40* (2006.01)
*H02M 1/08* (2006.01)
H01L 29/10 (2006.01)
H01L 29/423 (2006.01)
H02M 1/00 (2006.01)
H02M 3/155 (2006.01)

(52) U.S. Cl.
CPC ...... *H01L 29/7809* (2013.01); *H01L 29/7811* (2013.01); *H01L 29/7813* (2013.01); *H02M 1/08* (2013.01); H01L 29/0615 (2013.01); H01L 29/0623 (2013.01); H01L 29/063 (2013.01); H01L 29/0649 (2013.01); H01L 29/1095 (2013.01); H01L 29/4238 (2013.01); H02M 1/0054 (2021.05); H02M 3/155 (2013.01)

(56) References Cited

U.S. PATENT DOCUMENTS

| | | | |
|---|---|---|---|
| 6,630,698 | B1 | 10/2003 | Deboy et al. |
| 6,639,272 | B2 | 10/2003 | Ahlers et al. |
| 7,042,046 | B2 | 5/2006 | Onishi et al. |
| 7,161,209 | B2 | 1/2007 | Saito et al. |
| 7,622,771 | B2 | 11/2009 | Ono et al. |
| 7,737,469 | B2 | 6/2010 | Saito et al. |
| 7,973,362 | B2 | 7/2011 | Willmeroth et al. |
| 8,093,676 | B2 | 1/2012 | Schmidt |
| 9,209,292 | B2 * | 12/2015 | Schulze .............. H01L 29/0623 |
| 9,281,392 | B2 * | 3/2016 | Weyers ............. H01L 29/66068 |
| 9,418,851 | B2 * | 8/2016 | Hirler ................ H01L 29/0634 |
| 2001/0028083 | A1 | 10/2001 | Onishi et al. |
| 2004/0125968 | A1 | 7/2004 | Pearce et al. |
| 2005/0029584 | A1 | 2/2005 | Shiraishi et al. |
| 2006/0131644 | A1 | 6/2006 | Saito et al. |
| 2006/0157813 | A1 | 7/2006 | Saito et al. |
| 2006/0261375 | A1 | 11/2006 | Wahl et al. |
| 2007/0272979 | A1 | 11/2007 | Saito et al. |
| 2008/0001221 | A1 | 1/2008 | Yoshimura et al. |
| 2008/0237852 | A1 | 10/2008 | Yoshida et al. |
| 2008/0315297 | A1 * | 12/2008 | Takashita ................ H01L 29/32 257/328 |
| 2009/0045481 | A1 | 2/2009 | Niimura et al. |
| 2009/0096030 | A1 | 4/2009 | Ishida et al. |
| 2011/0140198 | A1 | 6/2011 | Inagawa et al. |
| 2012/0126328 | A1 | 5/2012 | Lin |
| 2013/0075760 | A1 | 3/2013 | Takaya et al. |
| 2013/0075819 | A1 | 3/2013 | Takei et al. |
| 2013/0093003 | A1 * | 4/2013 | Irifune ................ H01L 29/0878 257/329 |
| 2013/0119432 | A1 | 5/2013 | Lu |
| 2013/0249001 | A1 | 9/2013 | Willmeroth et al. |
| 2014/0097491 | A1 | 4/2014 | Bulucea |
| 2014/0231928 | A1 | 8/2014 | Willmeroth et al. |
| 2015/0001552 | A1 | 1/2015 | Hori et al. |
| 2015/0043116 | A1 | 2/2015 | Weyers et al. |
| 2015/0295028 | A1 | 10/2015 | Kagata et al. |
| 2015/0333168 | A1 | 11/2015 | Hirler et al. |
| 2015/0333169 | A1 | 11/2015 | Willmeroth et al. |

FOREIGN PATENT DOCUMENTS

| | | |
|---|---|---|
| DE | 10066053 A1 | 6/2002 |
| DE | 102005038260 B3 | 3/2007 |
| WO | 2011013379 A1 | 2/2011 |

* cited by examiner

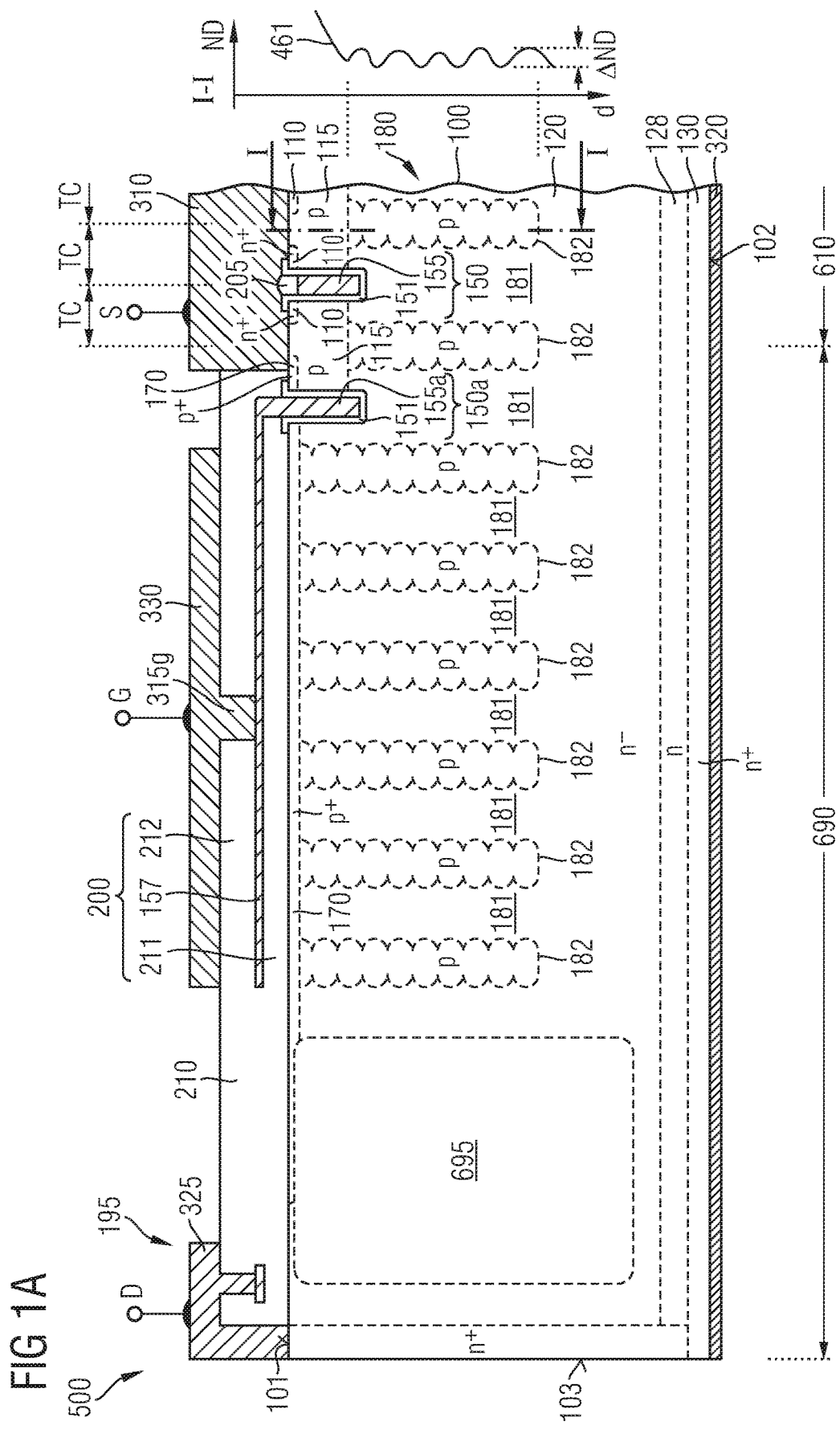

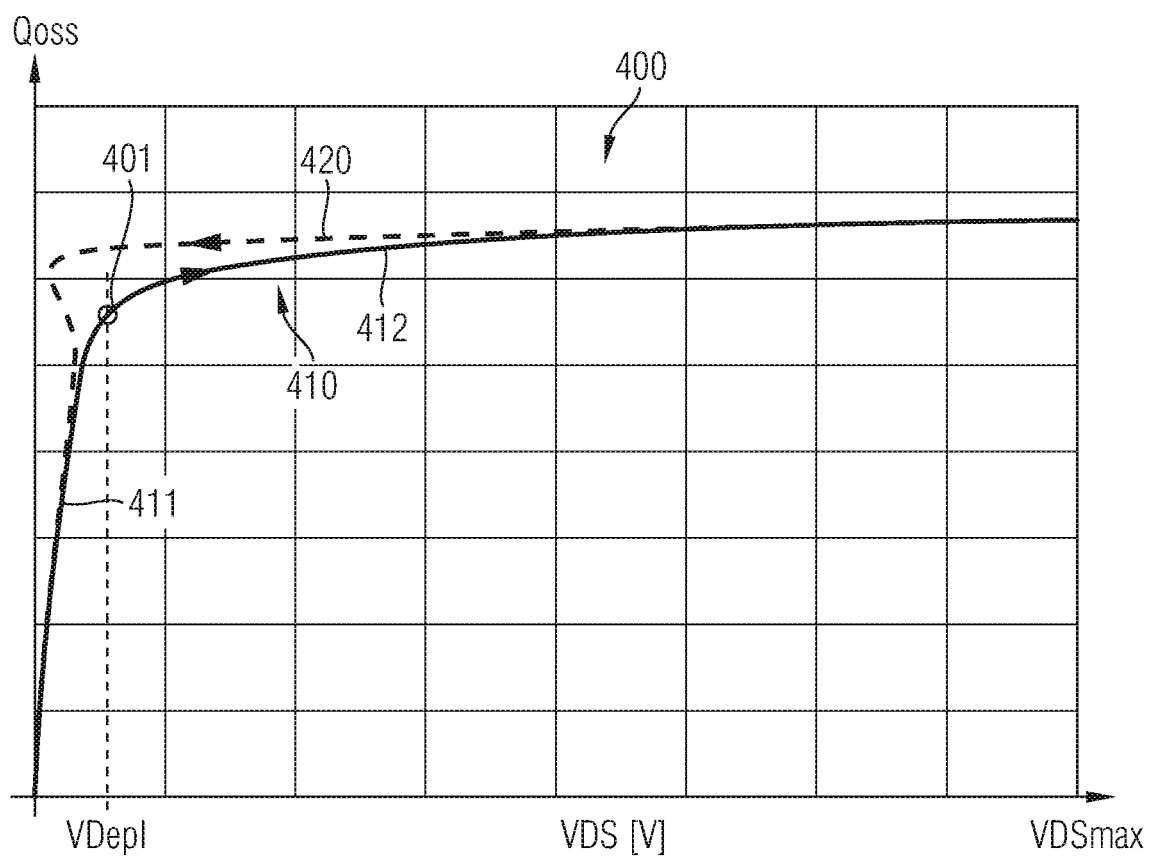

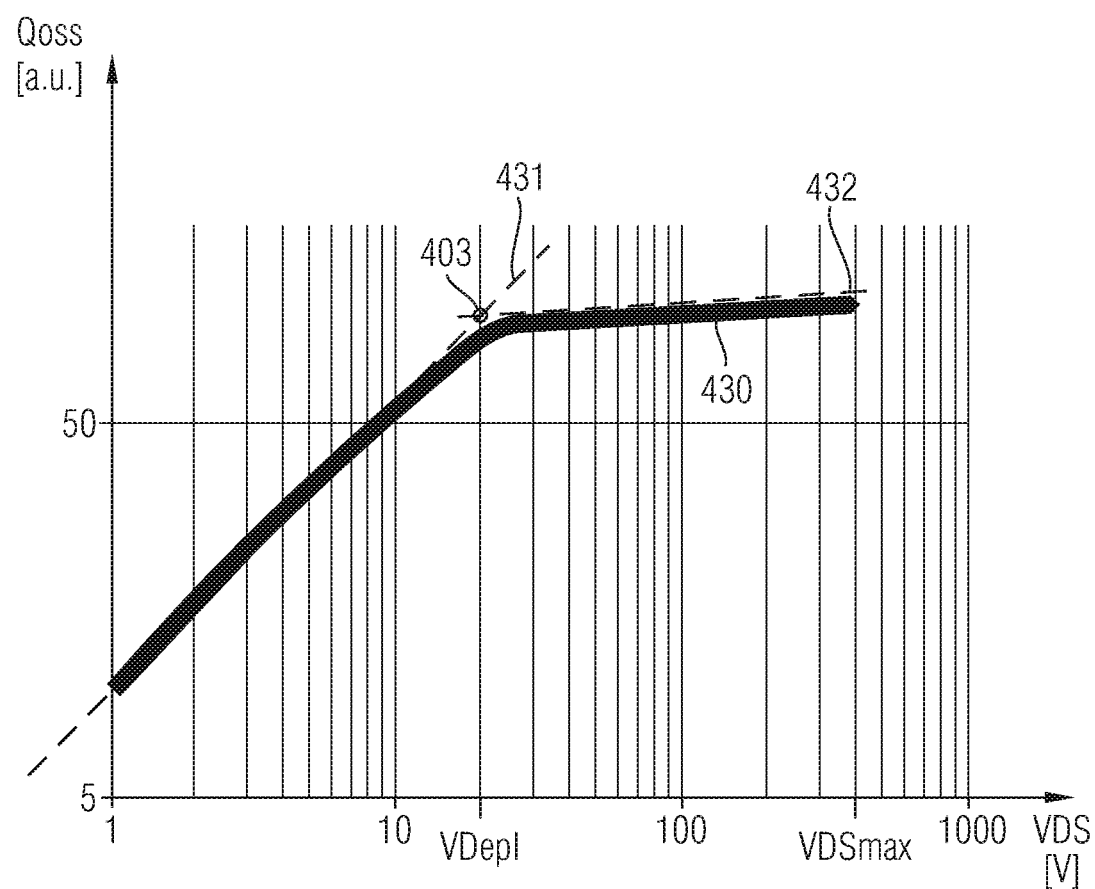

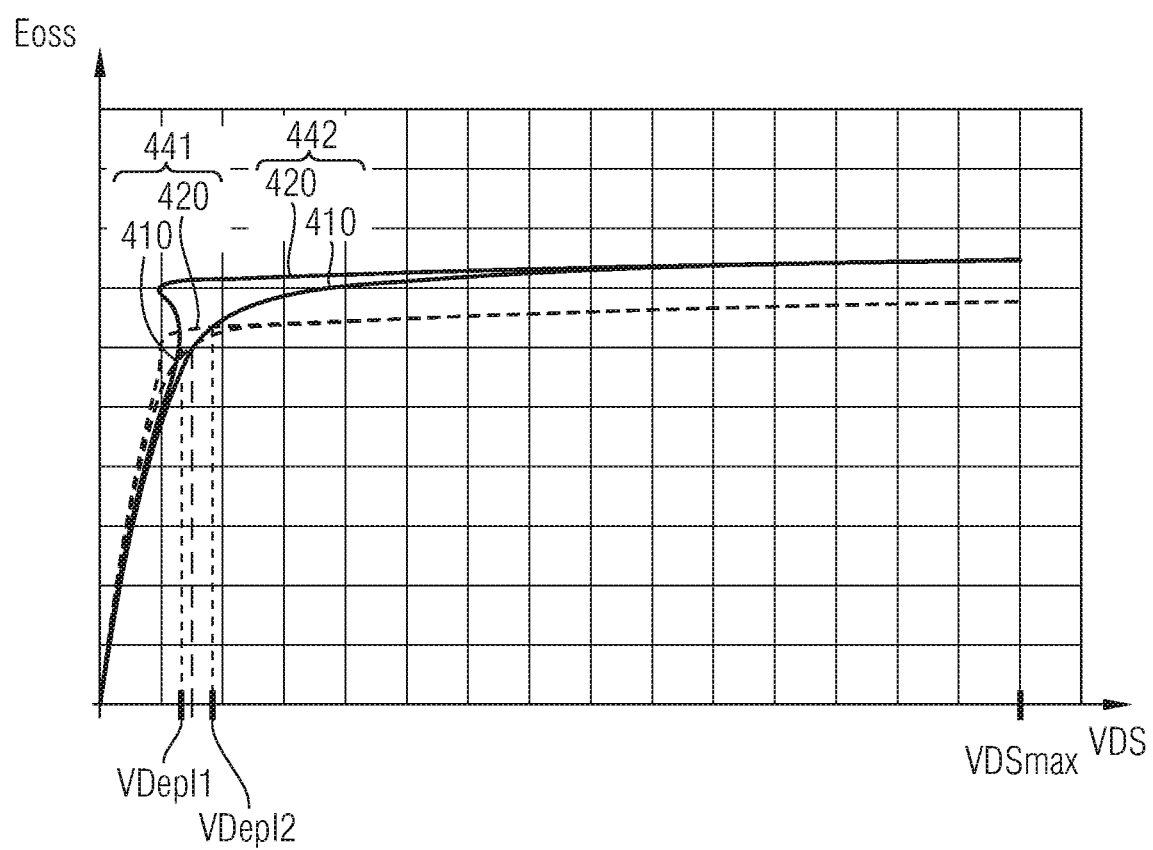

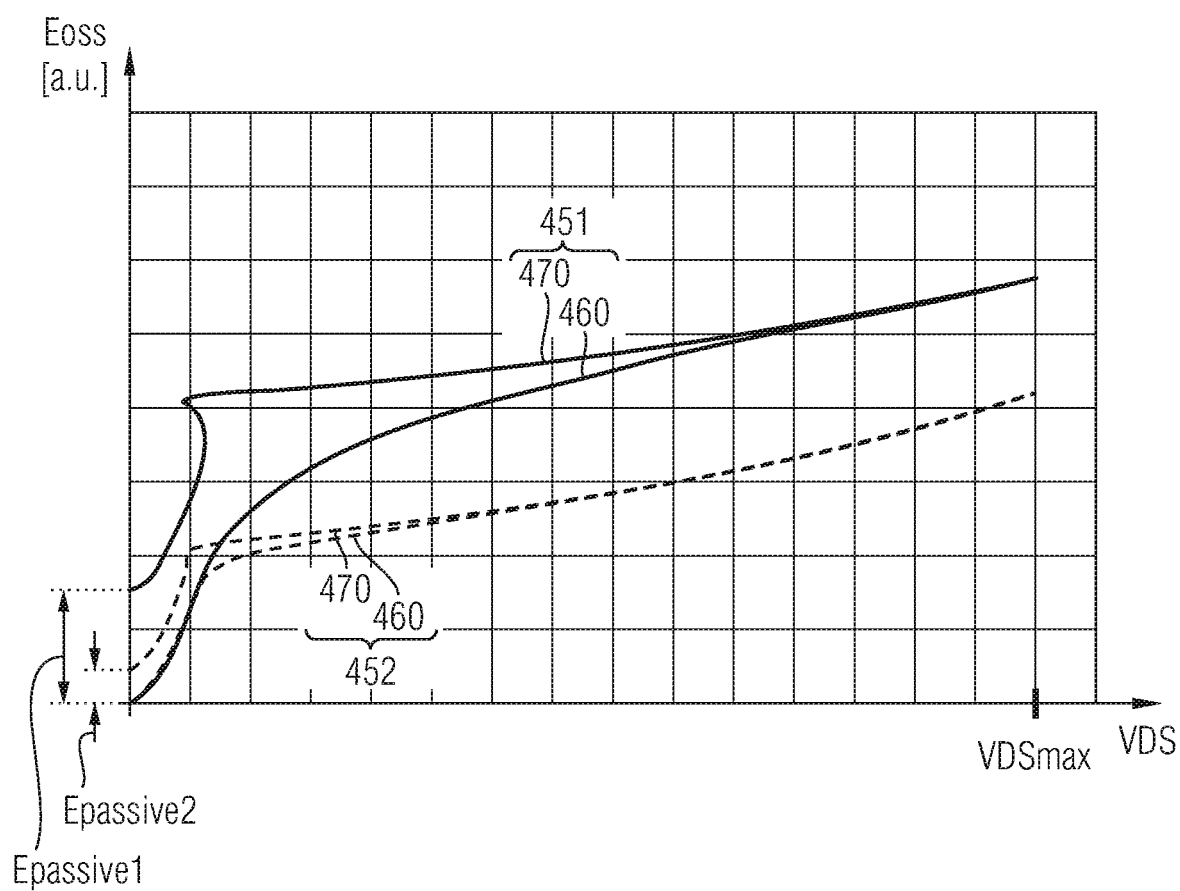

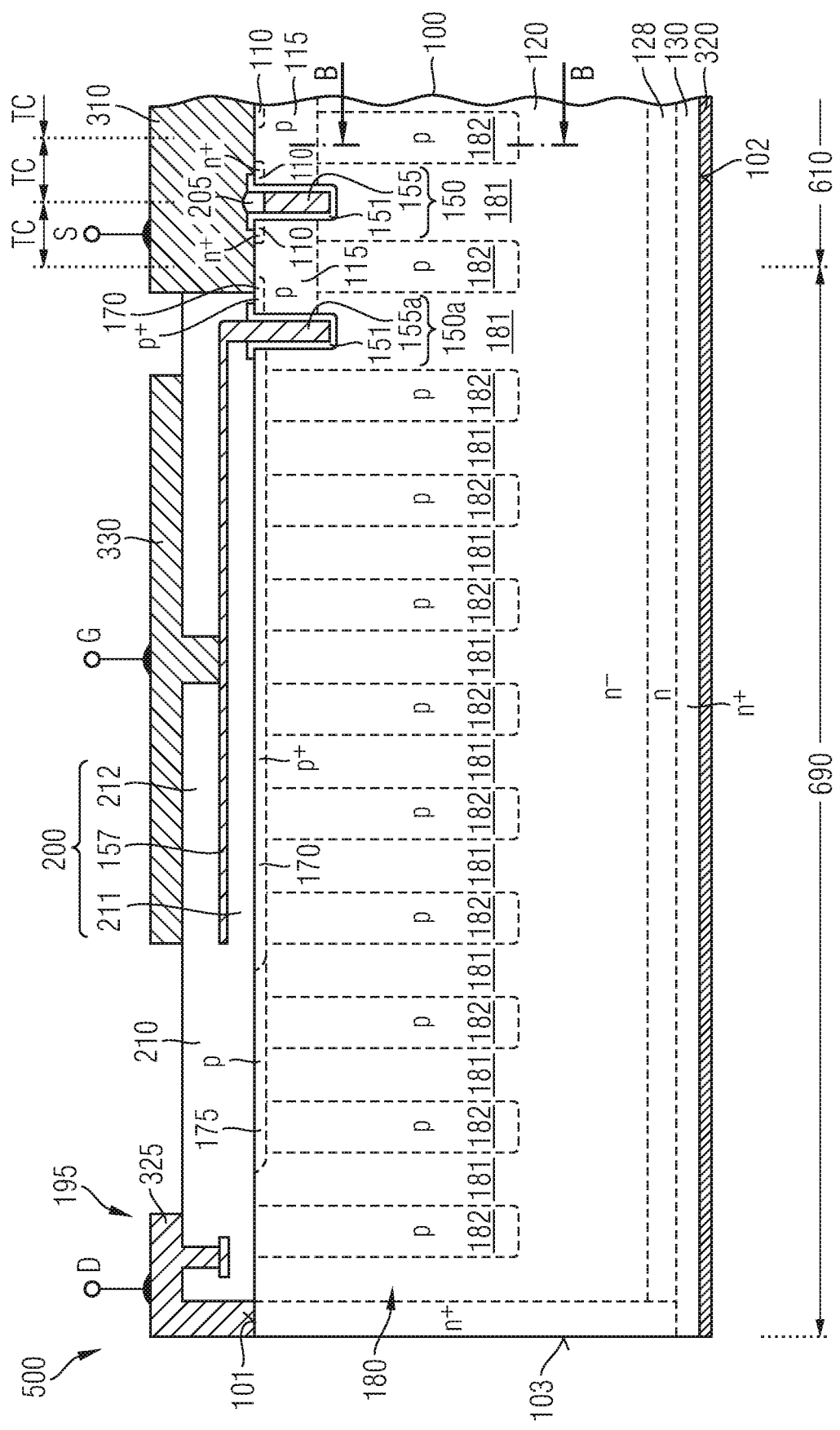

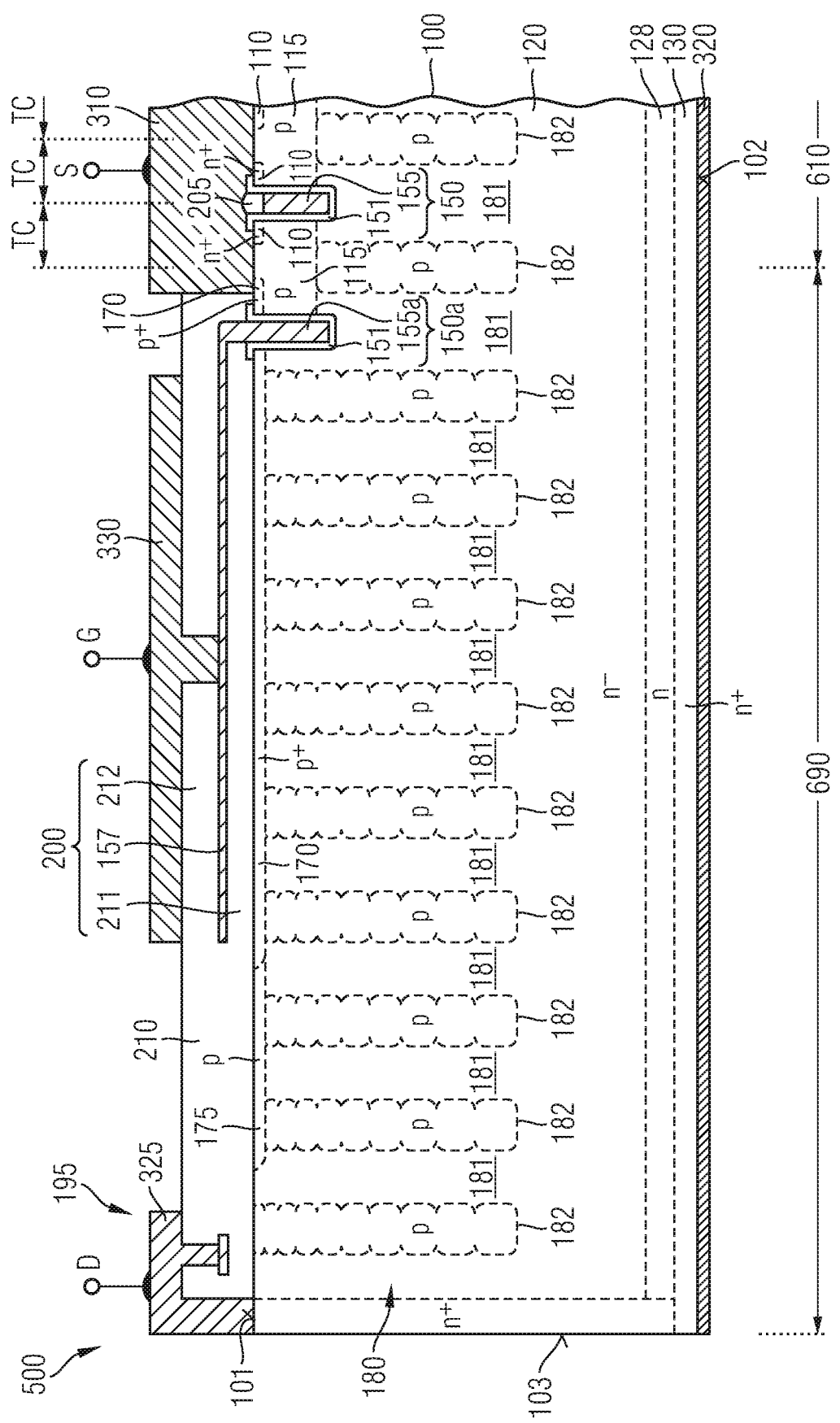

POWER SEMICONDUCTOR DEVICE HAVING VERTICALLY PARALLEL P-N LAYERS FORMED IN AN ACTIVE REGION UNDER TRANSISTOR CELLS AND UNDER A NON-DEPLETABLE EXTENSION ZONE FORMED IN THE EDGE REGION

BACKGROUND

Applications such as switched mode power supplies and half-bridge circuits often rely on power semiconductor switching devices including a compensation structure. The compensation structure laterally depletes in a reverse blocking mode and hence allows for increasing the dopant concentration in a drift zone of the semiconductor switching device without adversely affecting the reverse blocking characteristics.

It is desirable to provide semiconductor devices with reduced switching losses.

SUMMARY

According to an embodiment a semiconductor device includes a semiconductor body that includes transistor cells and a drift zone between a drain layer and the transistor cells. The drift zone includes a compensation structure. Above a depletion voltage a first output charge gradient obtained by increasing a drain-to-source voltage from the depletion voltage to a maximum drain-to-source voltage deviates by less than 5% from a second output charge gradient obtained by decreasing the drain-to-source voltage from the maximum drain-to-source voltage to the depletion voltage. At the depletion voltage the first output charge gradient exhibits a maximum curvature.

According to another embodiment a switched-mode power supply includes a power semiconductor device including a semiconductor body. The semiconductor body includes transistor cells and a drift zone between a drain layer and the transistor cells. The drift zone includes a compensation structure. Above a depletion voltage a first output charge gradient obtained by increasing a drain-to-source voltage from the depletion voltage to a maximum drain-to-source voltage deviates by less than 5% from a second output charge gradient obtained by decreasing the drain-to-source voltage from the maximum drain-to-source voltage to the depletion voltage. At the depletion voltage the first output charge gradient exhibits a maximum curvature.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended (advantages will be readily appreciated as they become better understood by reference to the following detailed description.

FIG. 1A is a schematic cross-sectional view of a portion of a semiconductor device with low Qoss (output charge) hysteresis according to an embodiment.

FIG. 1B is a schematic diagram plotting Qoss against VDS (drain-to-source voltage) for a semiconductor device according to the embodiments.

FIG. 1C is a schematic diagram plotting Qoss(VDS) for a semiconductor device according to an embodiment in a double logarithmic Cartesian coordinate system.

FIG. 1D is a schematic diagram comparing Qoss gradients for discussing effects of the embodiments.

FIG. 1E is a schematic diagram plotting Eoss (energy stored in the output capacitance) against VDS for increasing and decreasing VDS, respectively.

FIG. 2A is a schematic cross-sectional view of a portion of a semiconductor device in accordance with an embodiment combining smoothed vertical dopant profiles in a compensation structure with a non-depletable extension zone in the vertical projection of gate constructions.

FIG. 2C is a schematic cross-sectional view of a portion of a semiconductor device in accordance with an embodiment providing varying distances between local minima in the vertical dopant profiles of the compensation structures.

DETAILED DESCRIPTION

Figure 2B:
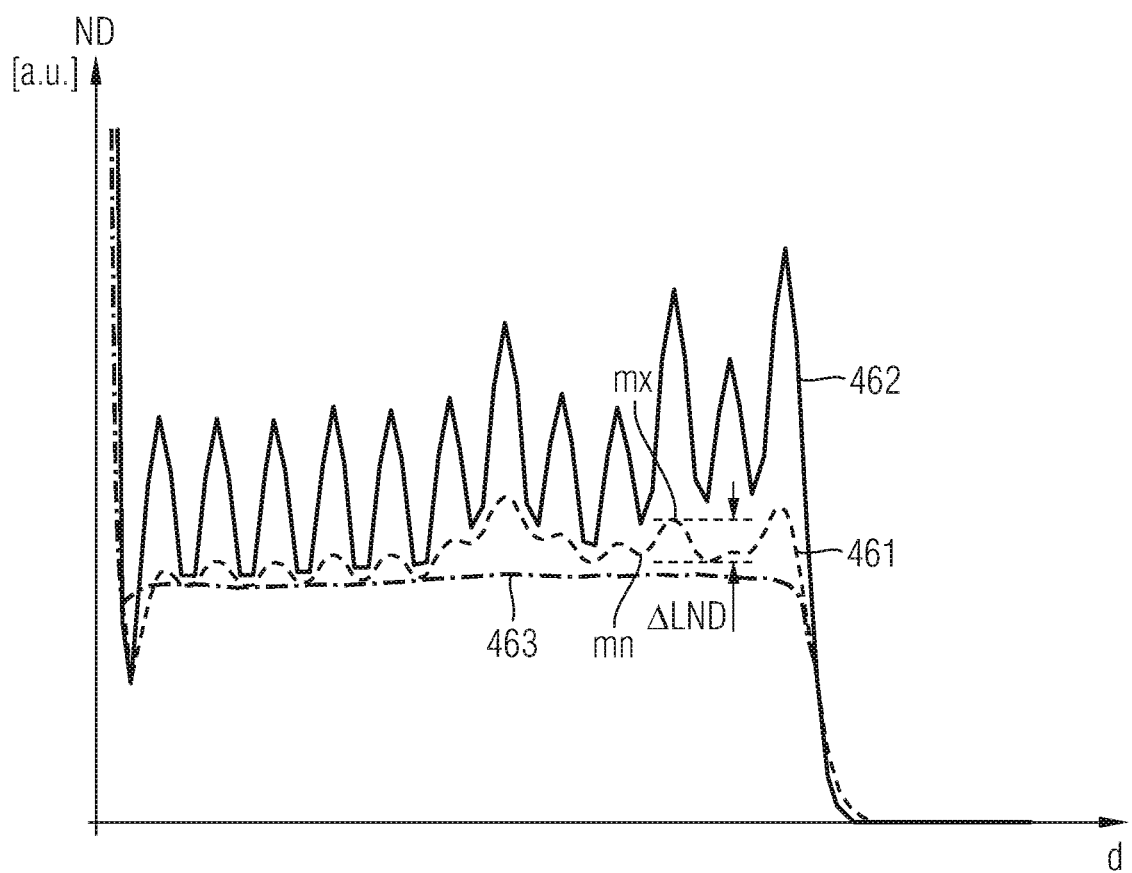
FIG. 2B is a schematic diagram with a vertical dopant concentration profile along line B-B of FIG. 2A for discussing effects of the embodiment of FIG. 2A

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1E refer to a semiconductor device 500 including transistor cells TC. The semiconductor device 500 may be or may include an IGFET (insulated gate field effect transistor), for example, an MOSFET (metal oxide semiconductor FETs) in the usual meaning including FETs with metal gates as well as FETs with non-metal gates, by way of example.

The semiconductor device 500 is based on a semiconductor body 100 from a single-crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor body 100 has a first surface 101 which may be approximately planar or which may be given by a plane spanned by coplanar surface sections as well as a mainly planar second surface 102 parallel to the first surface 101. A minimum distance between the first and second surfaces 101, 102 is selected to achieve a specified voltage blocking capability of the semiconductor device 500. A lateral surface 103 connects the first and second surfaces 101, 102.

In a plane perpendicular to the cross-sectional plane the semiconductor body 100 may have a rectangular shape with an edge length in the range of several millimeters or may be disc-shaped with a diameter of several centimeters. A normal to the first surface 101 defines a vertical direction and directions orthogonal to the vertical direction are horizontal directions.

The semiconductor body 100 includes a drift zone 120 of a first conductivity type as well as a drain layer 130 of the first conductivity type between the drift zone 120 and the second surface 102.

A dopant concentration in the drift zone 120 may gradually or in steps increase or decrease with increasing distance to the first surface 101 at least in portions of its vertical extension. According to other embodiments the dopant concentration in the drift zone 120 may be approximately uniform. A mean dopant concentration in the drift zone 120 may be between 5E12 cm$^{-3}$ and 1E15 cm$^{-3}$, for example in a range from 5E13 cm$^{-3}$ to 5E14 cm$^{-3}$. The drift zone 120 may include further doped zones, e.g., a compensation structure 180 such as a superjunction structure.

According to an embodiment, a field stop layer 128 of the conductivity type of the drift zone 120 may separate the drift zone 120 from the drain layer 130. A mean impurity concentration in the field stop layer 128 may be at least five times as high as the mean impurity concentration in the drift zone 120 and at most one-fifth of a maximum impurity concentration in the drain layer 130.

A dopant concentration in the drain layer 130 along the second surface 102 is sufficiently high to form an ohmic contact with a metal directly adjoining the second surface 102. In case the semiconductor body 100 is based on silicon Si, along the second surface 102 a dopant concentration in an n-type drain layer 130 may be at least 1E18 cm$^{-3}$, for example at least 5E19 cm$^{-3}$ and in a p-type drain layer 130 at least 1E16 cm$^{-3}$, for example at least 5E17 cm$^{-3}$.

The semiconductor device 500 further includes functional transistor cells TC in an active area 610, whereas an edge area 690 between the lateral surface 103 and the active area 610 is devoid of any functional transistor cells of the type present in the active area 610. Each transistor cell TC includes a body zone 115 of the second conductivity type forming a first pn junction with the drift zone 120 as well as source zones 110 forming second pn junctions with the body zones 115. The source zones 110 may be wells extending from the first surface 101 into the semiconductor body 100, for example into the body zones 115.

A gate structure 150 includes a conductive gate electrode 155 which may include or consist of a heavily doped polycrystalline silicon layer or a metal-containing layer. The gate structure 150 further includes a gate dielectric 151 separating the gate electrode 155 from the semiconductor body 100, wherein the gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof. The gate structure 150 may be a lateral gate formed outside the semiconductor body 100 along the first surface 101. According to the illustrated embodiment the gate structure 150 is a trench gate extending from the first surface 101 into the semiconductor body 100.

In the illustrated embodiments and for the following description, the first conductivity type is n-type and the second conductivity type is p-type. Similar considerations as outlined below apply to embodiments with the first conductivity being p-type and the second conductivity type being n-type.

When a voltage applied to the gate electrode 150 exceeds a preset threshold voltage, electrons accumulate in the channel portions of the body zones 115 directly adjoining the gate dielectric 151 and form inversion channels short-circuiting the first pn junctions for electrons.

The gate structure 150 may include an idle portion 150*a* including an idle gate electrode 155*a* in the edge area 690. The idle gate electrode 155*a* and the gate electrode 155 are electrically and structurally connected to each other and may be portions of the same layered structure. A gate construction 330 may be connected to the gate electrode 155 through the idle gate electrode 155a.

The gate construction 330 may include at least one of a gate pad, a gate finger, and a gate runner electrically connected to the gate electrode 155, respectively. A gate pad may be a metal pad suitable as a landing pad for a bond wire or another chip-to-leadframe or chip-to-chip connection like a soldered clip. The gate pad may be arranged between a first load electrode 310 and the lateral surface 103 or in a center portion of the semiconductor body 100. A gate runner may be a metal line surrounding the active area 610. A gate finger may be a metal line dividing the active area 610 into separated cell fields.

An interlayer dielectric 210 separates the gate construction 330 from the semiconductor body 100 and may insulate the gate electrode 155 from the first load electrode 310. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

A conductive structure 157 may structurally and electrically connect the idle gate electrode 155a with the gate construction 330 or with a gate contact structure 315g extending from the gate construction 330 into the interlayer dielectric 210. The conductive structure 157 can be a part of an integrated gate resistor or a polycrystalline silicon diode or can be omitted below the gate construction 330. A portion of the interlayer dielectric 210 between the conductive structure 157 and the semiconductor body 100 may form a field dielectric 211.

The gate electrode 155, the idle gate electrode 155a and the conductive structure 157 may be homogeneous structures or may have a layered structure including one or more metal containing layers. According to an embodiment the gate electrode 155, the idle gate electrode 155a and the conductive structure 157 may include or consist of a heavily doped polycrystalline silicon layer.

Contact structures may electrically connect the first load electrode 310 with the body zones 115 and the source zones 110. The first load electrode 310 may form or may be electrically coupled or connected to a first load terminal, for example the source terminal S in case the semiconductor device 500 is an n-IGFET.

A second load electrode 320, which directly adjoins the second surface 102 and the drain layer 130, may form or may be electrically connected to a second load terminal, which may be the drain terminal D in case the semiconductor device 500 is an n-IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, W, and Pd as main constituent(s), e.g., a silicide, a nitride and/or an alloy.

The drift zone 120 may include a compensation structure 180, e.g. a superjunction structure, including first zones 181 of the first conductivity type and second zones 182 of the second conductivity type. At least the second zones 182 or at least the first zones 181 may be columnar structures formed by several successive epitaxy/implantation steps. According to other embodiments the first and second zones 182 are formed on the basis of trenches. For example, the second zones 182 may be formed by depositing material containing p-type dopants into trenches temporarily formed between the first zones 181 or by introducing dopants through sidewalls of trenches temporarily extending from the first surface 101 into the drift zone 120.

The horizontal cross-sectional areas of the second zones 182 may be circles, ovals, ellipses or rectangles with rounded corners and the first zones 181 may form a grid with the second zones 182 arranged in the meshes. According to another embodiment horizontal cross-sectional areas of the first zones 181 are circles, ellipses, ovals or rectangles with rounded corners and the second zones 182 form a grid with the first zones 181 arranged in the meshes. In accordance with a further embodiment the first and second zones 181, 182 form a regular stripe pattern, wherein the stripes may cross the active area 610.

The dopant concentrations in the first and second zones 181, 182 may be adjusted to each other such that the portion of the drift zone 120 including the compensation structure 180 can be completely depleted in a reverse blocking mode of the semiconductor device 500.

In the vertical projection of at least a part of the gate construction 330, the semiconductor body 100 may include a non-depletable extension zone 170 of the second conductivity type. The non-depletable extension zone 170 is electrically connected to at least one of the body zones 115 and may directly adjoin or overlap with an outermost of the body zones 115, by way of example. A net dopant concentration in the non-depletable extension zone 170 is sufficiently high such that the non-depletable extension zone 170 is not completely depleted when the respective semiconductor device 500 is operated within its maximum voltage blocking ratings.

According to an embodiment the net dopant concentration of the non-depletable extension zone 170 is such that when a maximum voltage is applied between the first and second load electrodes 310, 320 the non-depletable extension zone 170 is not completely depleted regardless of a gate voltage applied to the gate construction 330 provided that the applied gate voltage is within the maximum ratings of the semiconductor device 500 for the gate voltage.

Alternatively or in addition to the non-depletable extension zone 170, the edge area 690 may include a low-charged edge portion 695 which is configured such that when the semiconductor device 500 reaches its maximum reverse breakdown voltage, less charge carriers are drained off per volume unit than in portions of the edge area 690 outside the low-charged edge portion 695, or, in case the low-charged edge portion 695 extends over the whole edge area 690, less charge carriers are drained off per volume unit than they would be drained off if the compensation structure 180 had the same configuration in the edge area 690 as in the active area 610.

For example, the first and second zones 181, 182 may be formed exclusively within the active area 610, whereas the edge area 690 or gate areas in the vertical projection of gate constructions 330 such as gate pads, gate fingers and/or gate runners are devoid of any compensation or superjunction structure and devoid of any first and second zones 181, 182. The semiconductor device 500 may include a compensation structure 180 with first and second zones 181, 182 in the active area 610 and only intrinsic or weakly doped regions of the first conductivity type having a lower net impurity concentration than the first zones 181 in the edge area 610. Alternatively, first zones 181 and second zones 182 may be completely or to a high degree superposed in the edge area 690 and/or in the vertical projection of gate areas to form the low-charged edge portion 695 as a region of low net dopant concentration in the concerned area. Alternatively or in addition to any of the described embodiments, the edge area 690 may include an insulator trench extending from the first surface 101 into the semiconductor body 100.

In addition to at least one of the low-charged edge portion 695 and the non-depletable extension zone 170, the first and second zones 181, 182 of the compensation structure 180 may have smooth vertical dopant profiles 461. For example, in case of compensation structures 180 resulting from a sequence of combined epitaxy/implantation steps, a vertical dopant profile of the first zones includes local maxima between local minima and the local maxima exceed the neighboring local minima by not more than 20%. A local concentration deviation AND is less than 20% between local minima. In case the compensation structures 180 are based on a trench process, starting from the respective body zone 115, for at least along 50% of the vertical extension of the concerned second zone 182 a total concentration deviation AND is less than 20%.

The semiconductor switching device 500 includes at least two of the non-depletable extension zone 170, the low-charged edge portion 695 and smoothed vertical dopant profile 461. For example, in switching devices, where the gate construction 330 in total extends over more than 20% of the active area 610, the semiconductor device 500 may include the non-depletable extension zone 170 and at least one of the low-charged edge portion 695 and the smoothed vertical dopant profiles 461 in the compensation structure 180. According to embodiments with the gate construction in total covering less than 10% of the active area 610, the semiconductor device 500 may include both the low-charged edge portion 695 and the compensation structure 180 with smoothed vertical dopant profiles 461.

By combining at least two of the smoothed vertical dopant profile 461, the non-depletable extension zone 170 and the low-charged edge portions 695 a difference between the charging and discharging process of the semiconductor device 500 during a reverse blocking mode is reduced which in turn significantly reduces the switching losses of the semiconductor device 500.

The switching losses are proportional to the energy Eoss stored in the output capacitance Coss in the reverse blocking mode of the semiconductor device 500. In semiconductor devices including a compensation structure the compensation zones are depleted at low reverse voltages and therefore exhibit comparatively low Coss and low Eoss. On the other hand, the depletion at low reverse voltages may result in an asymmetric charge/discharge behavior of the compensation structure 180 and hence, an asymmetric behavior of Coss.

The asymmetry is based on that the first and second zones 181, 182 (compensation zones) are charged at higher VDS than they are depleted/discharged. Since the energy applied for depleting is higher than the energy restored by charging, depleting and recharging results in energy losses. By combining at least two of the aforementioned features of smoothed vertical dopant profile 461, non-depletable extension zone 170 and low-charged edge portion 695, above a depletion voltage VDepl a first output charge gradient obtained by increasing VDS from 0 V to a maximum VDS deviates by less than 5% from a second output charge gradient obtained by decreasing VDS from the maximum VDS to 0 V.

The depletion voltage VDepl may be defined by the drain-to-source voltage VDS at which the curvature of the first output charge gradient has a local maximum, or where the second derivation of the first output charge gradient has a local minimum. In case of more than one local minimum, the depletion voltage VDepl is defined by the local minimum assigned to the lowest VDS. The depletion voltage VDepl indicates that VDS up to which the first output charge gradient is dominated by the depletion process of the compensation structure 180.

FIG. 1B shows the output charge Qoss as a function of the drain-to-source voltage VDS in case the semiconductor device 500 is switched off and no transistor channels are formed in the transistor cells TC. A first output charge gradient 410 describes the output charge Qoss when VDS is increased from 0 V to a maximum voltage VDSmax which may be the drain-to-source breakdown voltage V(BR)DSS specified in the data sheet of the respective semiconductor device, e.g., 400 V or 600 V. A second output charge gradient 420 is obtained by decreasing VDS from VDSmax to 0 V. The first output charge gradient 410 contains a point 401 of maximum curvature, where the second derivation of the first output charge gradient 410 has a local minimum. The point 401 is assigned to a depletion voltage VDepl. In case the second derivation contains more than one local minimum, the depletion voltage VDepl is defined by that one assigned to the lowest VDS among the candidate points.

When VDS is increased from 0 V to higher values, a first output charge gradient section 411 indicates a strong increase of Qoss indicating the continuous depletion of the compensation structure. At VDS=VDepl a significant portion of the compensation structure is completely depleted.

In a second output gradient section 412 above VDS=VDepl Qoss increases only at a comparatively low rate. When VDS is reduced, Qoss follows the second output charge gradient 420, wherein charge is gradually stored back in the compensation structure. Restoring the charge takes place at lower voltages than their depletion.

The first and second output charge gradients 410, 420 imply that a loss of Eoss based on Qoss contributes to passive energy losses Epassive. Epassive becomes of interest, where semiconductor switching devices switch on and off at low VDS in order to reduce switching losses, for example in resonant switched-mode power supplies. Epassive losses add up to the on state losses. Epassive includes also ohmic losses resulting from the charge carrier flow when the compensation structure is depleted. Such ohmic losses boost the hysteresis effect shown in FIG. 1B.

Portions of the compensation structure 180 in the edge area 690 and in the vertical projection of gate constructions contribute to Epassive. Holes discharged from portions of the compensation structure 180 in the edge area 690 and in the vertical projection of the gate constructions travel first in a vertical direction in the second zones 182 and then, at the first surface 101, along a horizontal direction in order to reach a contact to the first load electrode 310 of FIG. 1. By combining at least two of the above described features Epassive can be decreased in a way that the negative impact of the absence of the third feature does not conceal the improvement achieved by the two applied features.

FIG. 1C plots the output charge Qoss against VDS for the case VDS is increased from 0 V to VDSmax in a Cartesian coordinate system, whose ordinate and abscissa have a logarithmic scale, respectively. A first linear approximation 431 of the Qoss(VDS) characteristic 430 for 0<VDS>VDepl intersects a second linear approximation 432 of the Qoss (VDS) characteristic 430 for high VDS values at a point 403 assigned to a voltage at or close to VDS=VDepl.

FIG. 1D shows a first Qoss(VSD) characteristic 441 for the semiconductor device 500 of FIG. 1A and a second Qoss(VDS) characteristic 442 for a reference example. At VDS=VDepl2, for the reference example, a difference between the first output charge gradient 410 for the second Qoss(VDS) characteristic 442 obtained by increasing VDS from 0 V to VDSmax deviates by more than 5% from a second output charge gradient 420 of the second Qoss(VDS) characteristic 442 obtained by decreasing VDS from VDSmax to 0 V. With regard to the first Qoss(VDS) characteristic 441, above a depletion voltage VDepl1 a first output charge gradient 410 obtained by increasing VDS from 0 V to VDSmax deviates by less than 5% from a second output charge gradient 420 obtained by decreasing VDS from VDSmax to 0 V.

FIG. 1E illustrates effects of the embodiments using a diagram plotting Eoss(VDS) characteristics 451, 452. Eoss characteristic 451 refers to a reference device and shows Epassive as the differences between the first Eoss curve 460 obtained by increasing VDS and the respective second Eoss curve 470 obtained by decreasing VDS. The Eoss characteristics 452 for a semiconductor device according to an embodiment exhibits an energy difference Epassive2 which is significantly smaller than Epassive1 for the reference example.

In the semiconductor device of FIG. 2A the compensation structure 180 deeply extends into the edge area 690. In the semiconductor body 100, a non-depletable extension layer 170 is formed in the vertical projection of the gate construction 330 adjoining or close to the first surface 101. A vertical dopant profile of the p-type second zones 182 of the compensation structure 180 is smoothed such that local maxima exceed the neighboring local minima by not more than 20% of the value of the respective local minimum as shown in FIG. 2B.

FIG. 2B shows an embodiment of a smoothed vertical dopant profile 461 in the second zones 182 of the compensation structure 180 in the semiconductor device 500 of FIG. 2A. The smoothed vertical dopant profile 461 includes local maxima mx and local minima mn. A local dopant concentration deviation AND between a local maximum mx and the adjoining local minima mn is at most 20% of the value of the concerned local minimum mn, respectively. The non-smoothed vertical dopant profile 462 is that in a reference example.

When in an off-state of the semiconductor device 500 of FIG. 2A a reverse blocking voltage applied between drain and source of the semiconductor device 500 is increased, starting from the pn junction between adjoining first and second zones 181, 182 a depletion zone expands. Vertical sections of the compensation structure 180 with the lowest net dopant concentration may be completely depleted before vertical sections with higher dopant concentrations are completely depleted. Holes from a portion of the respective second zone 182 separated from the first load electrode 310 by a fully depleted intermediate vertical section traverse the respective depleted vertical section by transcending a potential threshold resulting from an electric field across the depleted vertical section. The charge carrier flow in the electric field results in non-capacitive losses which contribute to Epassive. By smoothing the vertical dopant profile, fewer holes traverse fully depleted vertical sections of the second zones 182 on the way to the first load electrode 110.

In addition, with the non-depletable extension zone 170, the smoothed vertical dopant profile allows a low Qoss hysteresis and low Epassive.

The vertical dopant profiles 461, 462 refer to a manufacture process including a plurality of combined epitaxy/implant steps. By contrast, the straight vertical dopant profile 463 refers to semiconductor devices whose compensation structure 180 results from a trench etch process. Starting from the interface between the body zone 115 and the second zone 182, a maximum dopant concentration deviation over at least 50% of the vertical extension of the second body zone 182 is less than 20%.

FIG. 2C refers to an embodiment where a vertical dopant profile of the first zones includes local maxima between local minima. A first distance between two first neighboring local minima deviates from a second distance between two second neighboring local minima at a greater distance to the drain layer than the first neighboring local minima. In the semiconductor device 500 of FIG. 2C vertical extensions of sub portions of the first and second zones 181, 182 are greater at a greater distance to the first surface 101. According to other embodiments, the vertical extensions of sub portions of the first and second zones 181, 182 are greater at a lower distance to the first surface 101. By varying the distance between the sub portions and the thickness of the respective epitaxial sublayers, the dopant profile may be further smoothed.

Figure 3:
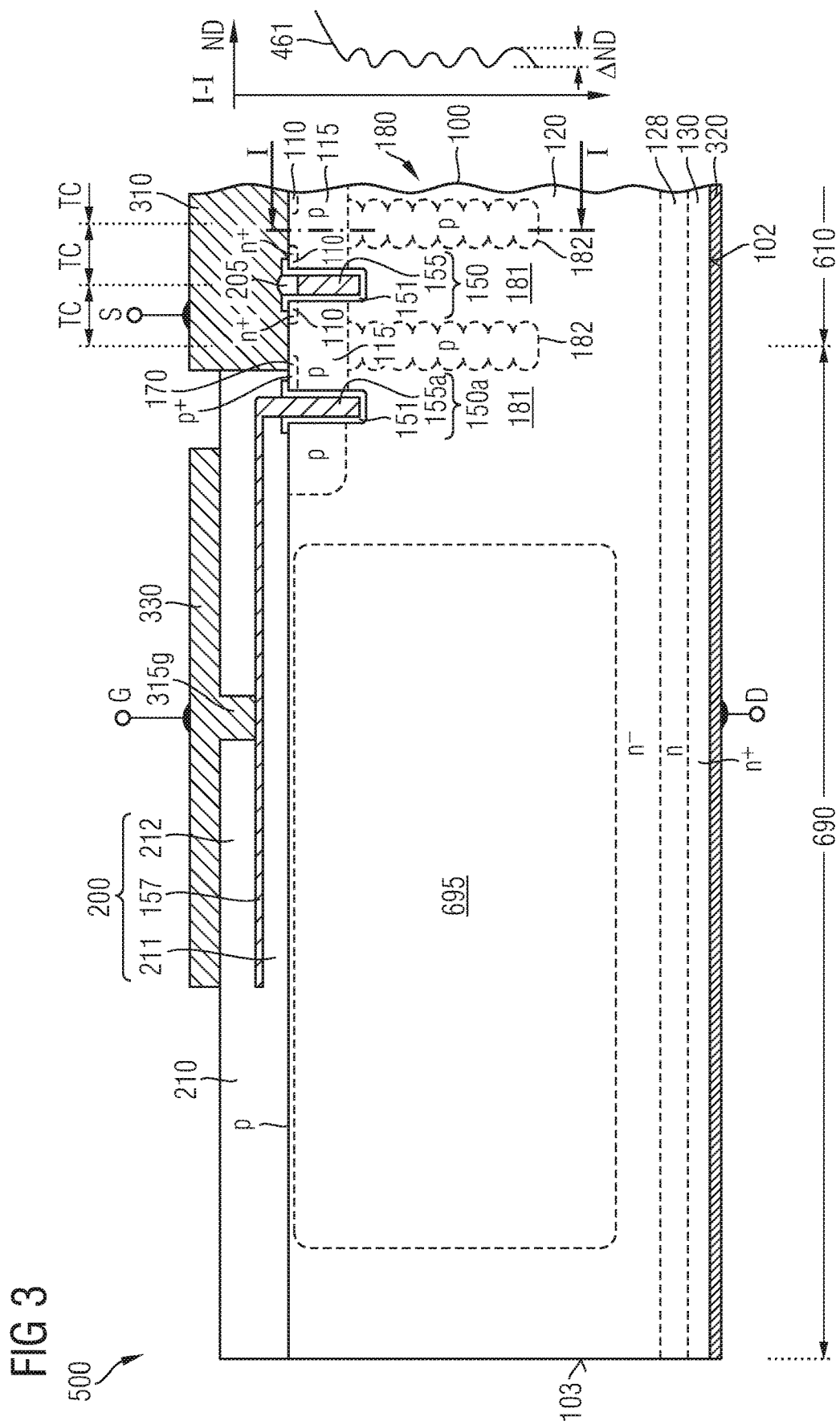
FIG. 3 is a schematic cross-sectional view of a portion of a semiconductor device in accordance with an embodiment combining smoothed vertical dopant profiles in a compensation structure with a low-charged edge portion.

The semiconductor device 500 of FIG. 3 combines smoothed vertical dopant profiles 461 with a low-charged edge portion 695. From the low-charged edge portion 695 less charge carriers per volume unit are removed with increasing reverse blocking voltage than in portions of the edge area 690 outside the low-charged edge portion 695. According to the illustrated embodiment, the low-charged edge portion 695 is devoid of first and second zones 181, 182 and as a consequence Epassive is reduced.

In FIGS. 4A to 4D in the active area 610 a cell construction 199 includes source zones, body zones and gate structures, which may be planar gate structures or trench gate structures of the transistor cells TC. As regards further details of the active area 610 as well as the load electrodes, reference is made to the description of FIGS. 1A, 2A, and 3.

Figure 4A:
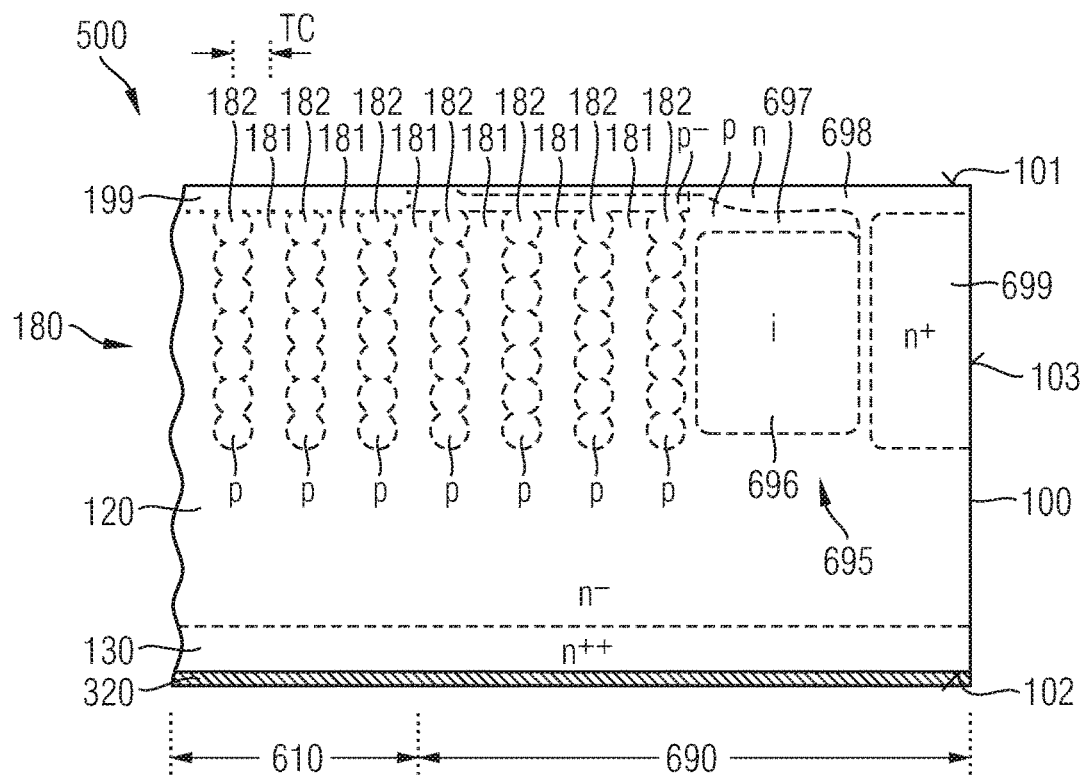
FIG. 4A is a schematic cross-sectional view of the edge portion of FIGS. 1A and 3 according to an embodiment including an intrinsic edge area.

According to the embodiment of FIG. 4A the low-charged edge portion 695 includes an intrinsic portion 696 in an outer portion of the edge area 690. The compensation structure 180 may extend from the active area 610 into a portion of the edge area 690 between the intrinsic portion 696 and the active area 610. A p-type connection layer 697 may directly adjoin the intrinsic portion 696 at the side of the first surface 101 and may connect the second zones 182 with the body zones of the transistor cells TC. The edge area 690 may further include an n-type vertical field stop 699 and an n-type junction termination extension 698.

Figure 4B:
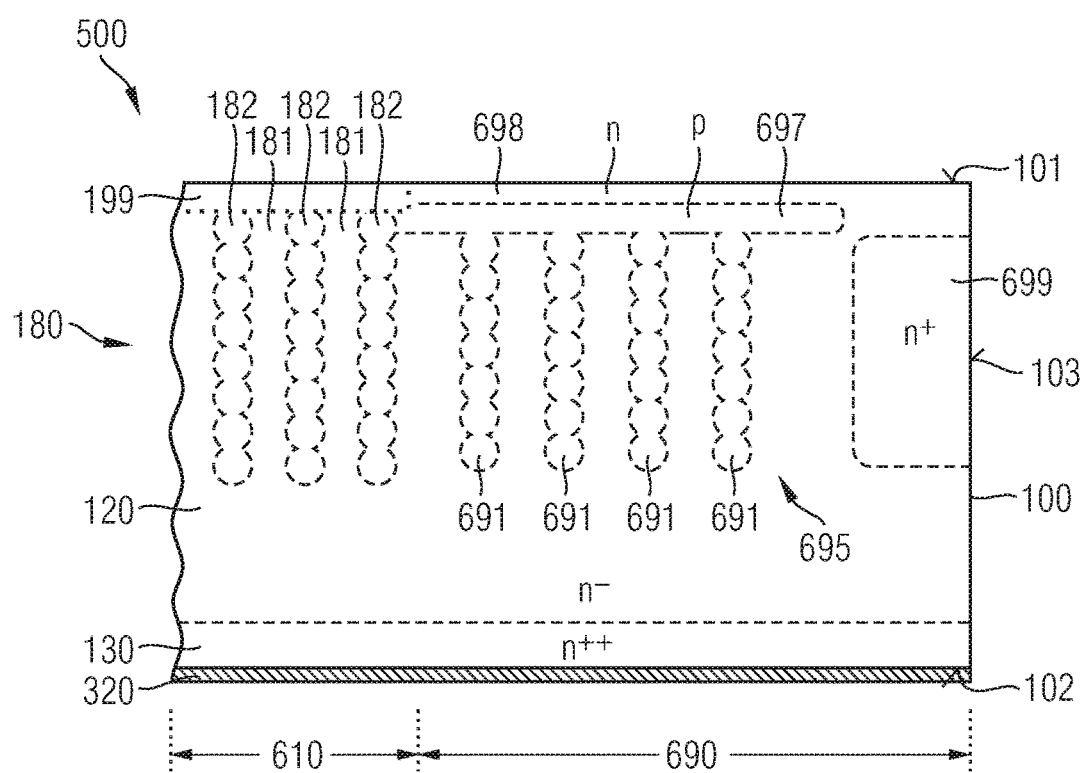
FIG. 4B is a schematic cross-sectional view of the edge portion of FIGS. 1A and 3 according to an embodiment including overlapping zones in the edge area.

In FIG. 4B the semiconductor body 100 of the semiconductor device 500 includes a low-charged edge portion 695 with overlapping zones 691, wherein in the overlapping zones 691 two complementary implants superpose each other such that their charges compensate for each other even without a reverse blocking voltage applied. In the reverse blocking mode only a small amount of charges is depleted from the low-charged edge portion 695. A p-type connection layer 697 may directly adjoin the overlapping zones 691 at the side oriented to the first surface and may connect them with the body zones of the transistor cells TC. The compensation structure 180 may or may not include a portion formed in the edge area 690 between the low-charged edge portion and the active area 610.

Figure 4C:
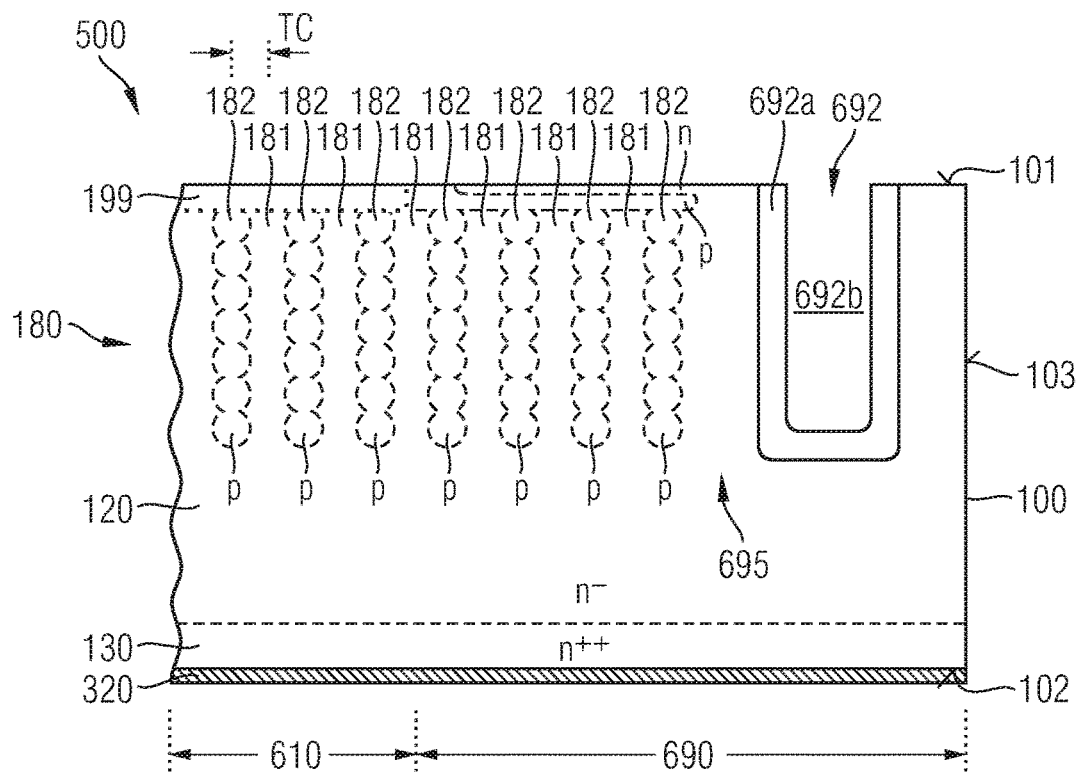
FIG. 4C is a schematic cross-sectional view of the edge portion of FIGS. 1A and 3 according to an embodiment including an insulator structure in the edge area.

FIG. 4C refers to an embodiment with the low-charged edge portion 695 including an insulator structure 692 extending from the first surface 101 into the semiconductor body 100. The insulator structure 692 may be a solid structure from a dielectric material. According to the illustrated embodiment the insulator structure 692 includes a dielectric layer 692a lining a sidewall of a trench in the semiconductor body 100 as well as a void 692b in the remaining trench portion. The insulator structure 692 consumes a portion of the volume of the edge area 690 such that less charge carriers are depleted from the edge area 690 in the reverse blocking mode than in case of absence of the insulator structure 692.

Figure 4D:
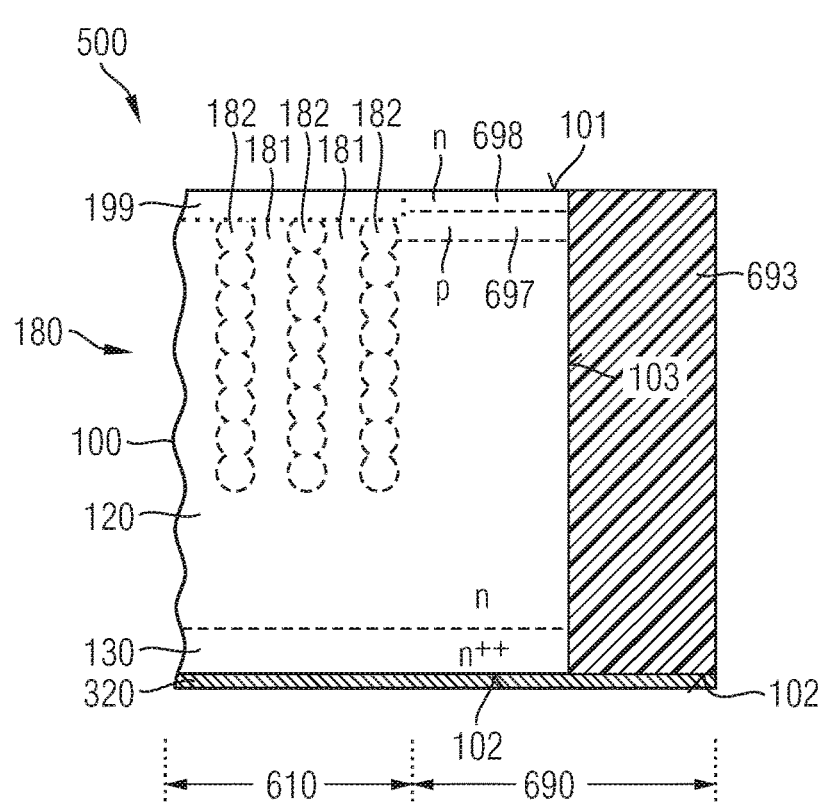
FIG. 4D is a schematic cross-sectional view of the edge portion of FIGS. 1A and 3 according to an embodiment including an edge insulator structure.

In FIG. 4D an edge insulator structure 693 extends along the lateral surface 103 of the semiconductor body 100. The edge insulator structure 693 may contain a dielectric based on a polymer, e.g., a polyimide. In the reverse blocking mode, an electric field is accommodated in the vertical direction. The semiconductor volume of the edge area 690 is small and only few charge carriers are removed, when a reverse blocking voltage is applied.

Figure 5:
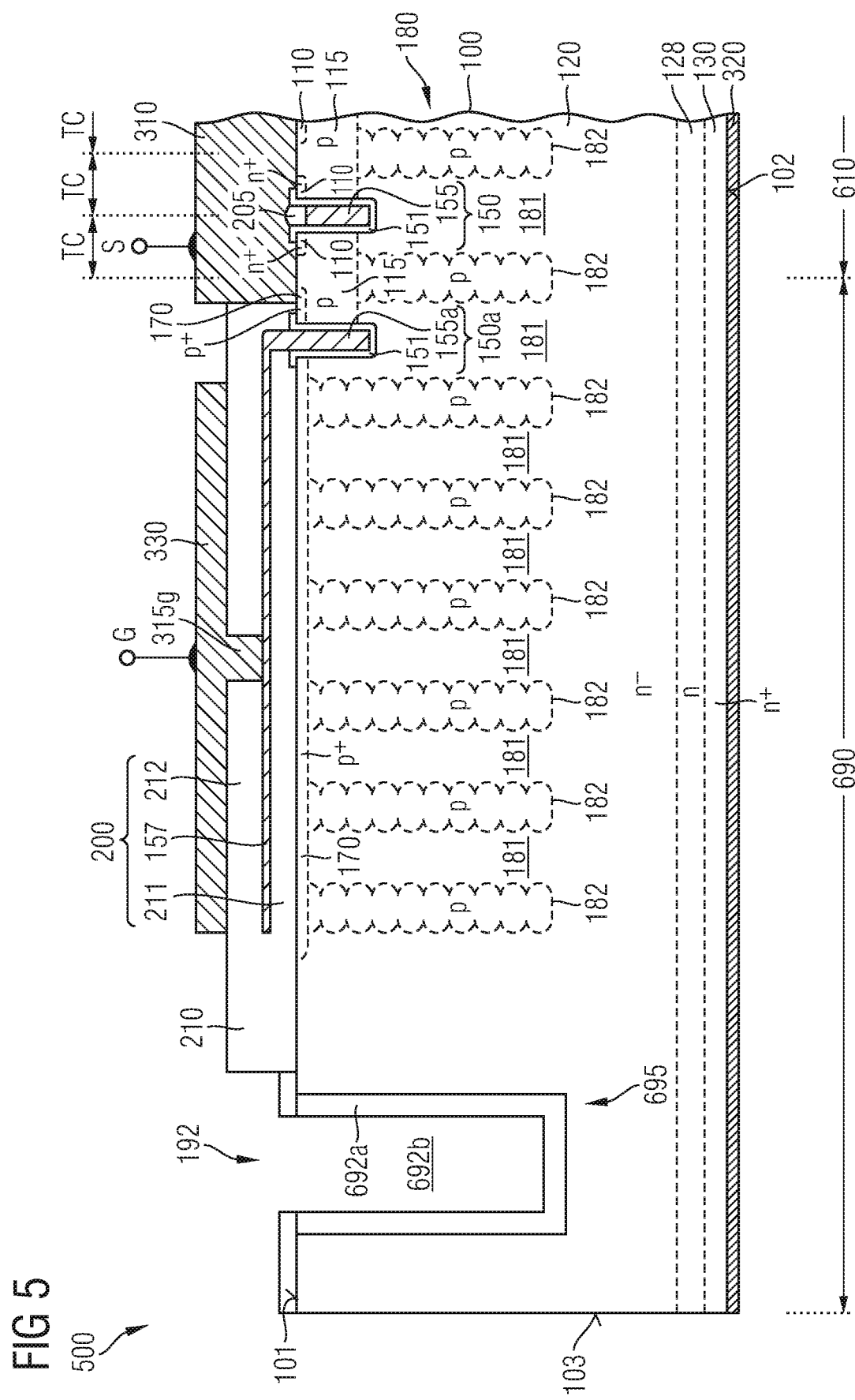
FIG. 5 is a schematic cross-sectional view of a portion of a semiconductor device in accordance with an embodiment combining a low-charged edge portion with a non-depletable extension zone in the vertical projection of gate constructions.

In FIG. 5 the semiconductor device 500 combines a low-charged edge portion 695 including an insulator structure 692 with a non-depletable extension zone 170 in the vertical projection of gate constructions 330. The gate construction 330, which may include at least one of a gate pad, gate fingers and gate runners, may extend over at least 10%, e.g., 20% or 35% of the first surface 101.

Figure 6A:
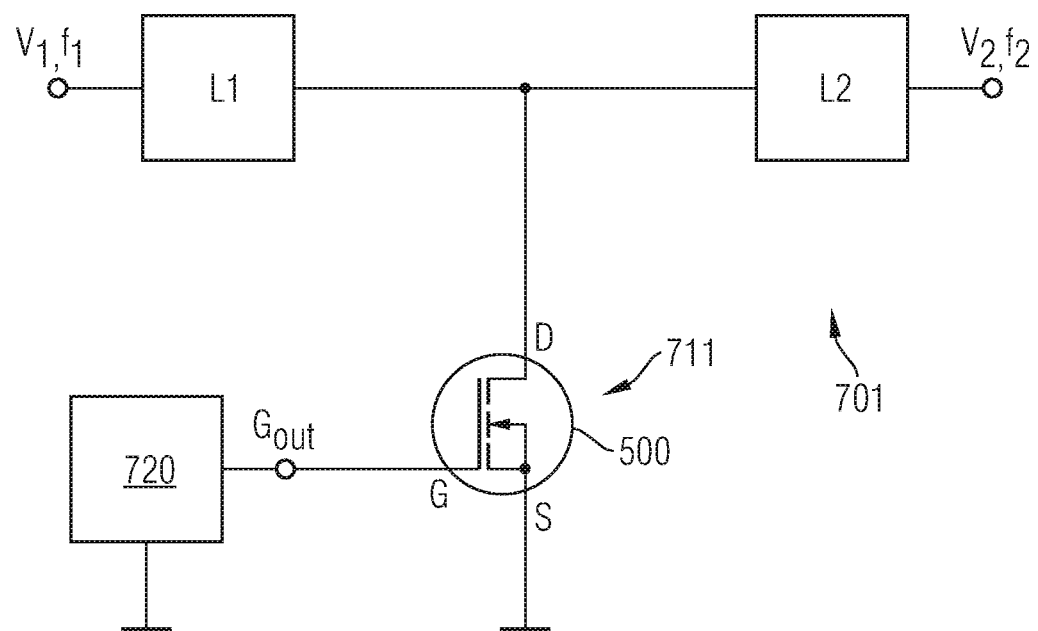
FIG. 6A is a schematic circuit diagram of a switched-mode power supply according to a further embodiment.

FIG. 6A concerns a switched-mode power supply 701 with one of the semiconductor devices 500 of the previously described embodiments used as a switching device 711. A gate driver circuit 720 generates a gate signal at an output terminal Gout. The gate signal is supplied to a gate terminal G of the switching device 711. The switching device 711 controls storing energy received from a source at a first voltage and a first frequency f1 in an inductive element L1, e.g. a transformer winding, and releasing the stored energy to a load L2 at a second frequency f2 and/or second voltage level V2, wherein f1 and/or f2 may be 0 Hz. The gate signal may be a square signal of a certain frequency which may be continuously adapted to load conditions.

The switched-mode power supply 701 may be of a hard switched type. According to another embodiment the switched-mode power supply may be of the resonant type with the switching device 711 switching only when the voltage across the load terminals D, S of the switching device 711 is at or close to 0V. The switched-mode power supply 701 may be of the buck or boost converter type, by way of example. According to an embodiment, the switched-mode power supply may be a DC/DC converter.

Figure 6B:
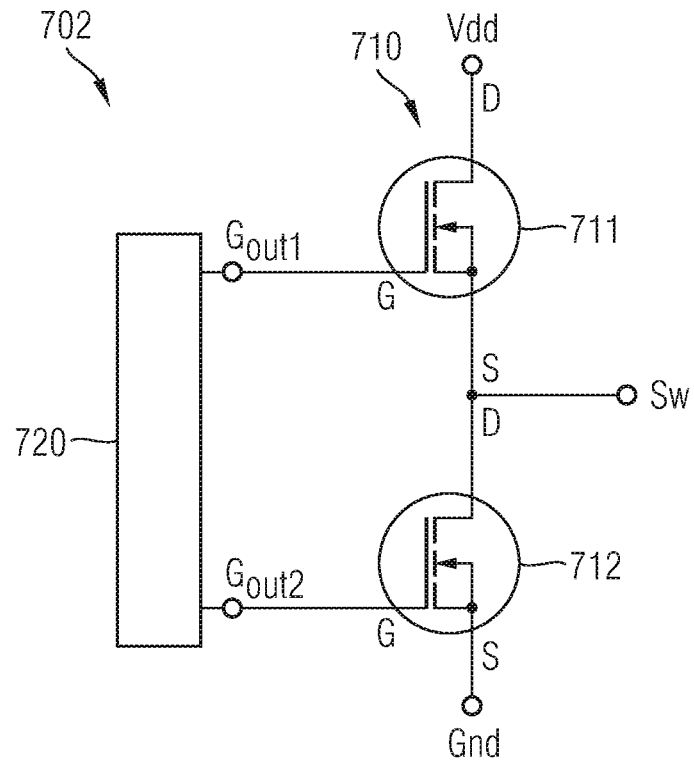
FIG. 6B is a schematic circuit diagram of a half-bridge circuit according to an embodiment with n-type high-side switch.
Figure 6C:
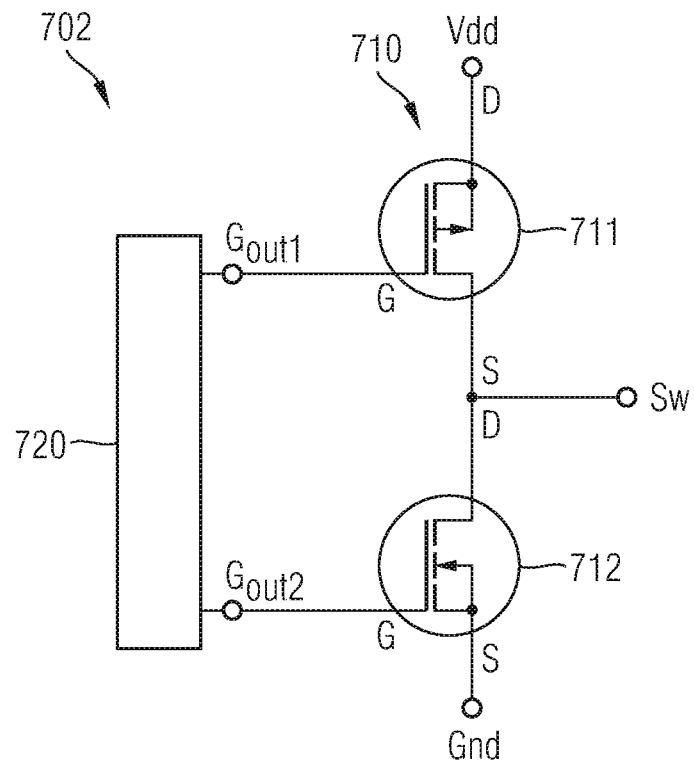
FIG. 6C is a schematic circuit diagram of a half-bridge circuit according to an embodiment with p-type high-side switch.

FIGS. 6B to 6C refer to electronic circuits 702 including one or more half-bridge circuits 710 based on two semiconductor switching devices 711, 712 whose load current paths are connected in series between Vdd and Gnd. The semiconductor switching devices 711, 712 may be IGFETs. At least one of the semiconductor switching devices 711, 712 may be or may include one of the semiconductor devices 500 of the previous figures. The half-bridge circuit 710 or the complete electronic circuit 702 may be integrated in a power module.

The electronic circuit 702 may include a gate driver circuit 720 generating and driving a first gate signal at a first driver terminal Gout1 and a second gate signal at a second driver terminal Gout2. The first and second driver terminals Gout1, Gout2 are electrically coupled or connected to gate terminals G of the semiconductor switching devices 711, 712. The gate driver circuit 120 controls the gate signals such that during regular switching cycles the first and second switching devices 711, 712 are alternatingly in the on state. During desaturation cycles, the gate driver circuit 720 may apply desaturation pulses before switching one of the switching devices 711, 712 into the on state.

In FIG. 6B the switching devices 711, 712 are n-IGFETs with a source terminal S of the first switching device 711 and a drain terminal D of the second switching device 712 electrically connected to a switching terminal Sw.

In FIG. 6C the first switching device 711, 712 is a p-IGFET and the second switching device 712 is an n-IGFET.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switched-mode power supply comprising a power semiconductor device that comprises:
    a semiconductor body comprising transistor cells and a drift zone between a drain layer and the transistor cells, the transistor cells comprising source zones,
    wherein the device exhibits a first output charge gradient when a voltage between the drain layer and the source zones of the transistor cells increases from a depletion voltage of the semiconductor device to a maximum drain/source voltage of the semiconductor device,
    wherein the device exhibits a second output charge gradient when a voltage between the drain layer and the source zones of the semiconductor device decreases from the maximum drain/source voltage to the depletion voltage of the semiconductor device, and
    wherein the semiconductor device is configured such that the first output charge gradient deviates by less than 5% from the second output charge gradient.

2. The switched-mode power supply of claim 1, wherein the drift zone comprises a compensation structure, wherein the compensation structure includes first zones of a first conductivity type and second zones of a second, opposite conductivity type, the first and second zones alternately arranged along a horizontal direction orthogonal to a vertical direction, the vertical direction defined by a direct connection line between one of the transistor cells and the drain layer.

3. The switched-mode power supply of claim 2, wherein a vertical dopant profile of the first zones includes local maxima between local minima and the local maxima exceed the neighboring local minima by not more than 20%.

4. The switched-mode power supply of claim 2, wherein the transistor cells are arranged in an active area of the semiconductor body, and an edge area between the active area and a lateral surface of the semiconductor body is devoid of transistor cells.

5. The switched-mode power supply of claim 4, wherein the edge area comprises at least one of an intrinsic portion, an insulator trench or pairs of superposed first and second zones.

6. The switched-mode power supply of claim 4, wherein the edge area in total comprises less first and second zones per volume unit than the active area or is devoid of the first and second zones.

7. The switched-mode power supply of claim 4, further comprising:
- an interlayer dielectric structure adjoining a first surface of the semiconductor body and separating, in the edge area, a gate construction from the semiconductor body; and
- a non-depletable extension zone in the semiconductor body in a vertical projection of at least a portion of the gate construction, wherein the non-depletable extension zone is of a conductivity type of body zones of the transistor cells and electrically connected to one of the body zones.

8. The switched-mode power supply of claim 7, wherein the non-depletable extension zone extends over at least 40% of a vertical projection of the gate construction.

9. The switched-mode power supply of claim 7, wherein the non-depletable extension zone is electrically connected to a load electrode.

10. The switched-mode power supply of claim 7, wherein in the non-depletable extension zone an effective dopant dose is greater than 2.5E12 $cm^{-2}$.

11. The switched-mode power supply of claim 1, wherein an areal on state resistance of the semiconductor device is less than 1.5 Ohm*$mm^2$ and a breakdown voltage is greater than 600 V.

12. A semiconductor device, comprising:
a semiconductor body comprising:
- a drain layer extending to a rear surface of the semiconductor body;
- a drift zone disposed over the drain layer and having a lower dopant concentration than the drain layer;
- an active area comprising one or more transistor cells, each of the transistor cells comprising source zones disposed over the drift zone and extending to a main surface of the semiconductor body that is opposite from the rear surface, and a gate configured to control a conductive channel between the source zones and the drain layer;

wherein the semiconductor device exhibits a first output charge gradient when a voltage between the drain layer and the source zones increases from a depletion voltage of the semiconductor device to a maximum drain/source voltage of the semiconductor device, wherein the semiconductor device exhibits a second output charge gradient when a voltage between the drain layer and the source zones of the semiconductor device decreases from the maximum drain/source voltage to the depletion voltage of the semiconductor device, and wherein the semiconductor device is configured such that the first output charge gradient deviates by less than 5% from the second output charge gradient.

13. The semiconductor device of claim 12, wherein the drift zone comprises a compensation structure, wherein the compensation structure includes first zones of a first conductivity type and second zones of a second, opposite conductivity type, the first and second zones alternately arranged along a horizontal direction that is parallel to the main and rear surfaces, and wherein a vertical dopant profile of the first zones includes local maxima between local minima and the local maxima exceed the neighboring local minima by not more than 20%.

14. The semiconductor device of claim 13, wherein the semiconductor body further comprises an edge area that is devoid of the transistor cells that separates the active area from a lateral surface of the semiconductor body, the lateral surface extending between the main and rear surfaces, and wherein the edge area comprises at least one of an intrinsic portion, an insulator trench or pairs of superposed ones of the first and second zones.

* * * * *